(12) United States Patent
Nakahara

(10) Patent No.: US 8,314,638 B2
(45) Date of Patent: Nov. 20, 2012

(54) COMPARATOR CIRCUIT

(75) Inventor: Akihiro Nakahara, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 307 days.

(21) Appl. No.: 12/656,334

(22) Filed: Jan. 26, 2010

(65) Prior Publication Data

US 2010/0207666 A1    Aug. 19, 2010

(30) Foreign Application Priority Data

Feb. 17, 2009   (JP) .................................. 2009-033672

(51) Int. Cl.
    *H03K 5/153*   (2006.01)
(52) U.S. Cl. .............................. 327/77; 327/80; 327/81
(58) Field of Classification Search .............. 327/77–81, 327/143
    See application file for complete search history.

(56) References Cited

U.S. PATENT DOCUMENTS

| 5,434,521 | A | 7/1995 | Leipold et al. |
| 5,834,954 | A | 11/1998 | Tihanyi |
| 2003/0227306 | A1* | 12/2003 | Di Iorio ........................ 327/143 |
| 2008/0084232 | A1* | 4/2008 | Huang et al. .................... 327/77 |

FOREIGN PATENT DOCUMENTS

| JP | 5-249148 | 9/1993 |
| JP | 9-46191 | 2/1997 |

* cited by examiner

*Primary Examiner* — Long Nguyen
(74) *Attorney, Agent, or Firm* — McGinn IP Law Group, PLLC

(57) ABSTRACT

A comparator circuit, includes first and second terminals to which a reference voltage that determines a threshold voltage is inputted, a third terminal to which a standard voltage is inputted, a fourth terminal to which a target voltage that is to be detected and is based on the standard voltage is inputted, first and second transistors of a first conductivity type including control terminals to the first and second terminals, respectively, the first and second transistors flowing currents depending on a potential difference of the reference voltage, a third transistor of a second conductivity type connected between the first transistor and the fourth terminal, and a fourth transistor of the second conductivity type connected between the second transistor and the third terminal, the fourth transistor flowing a mirror current depending on a current passing through the third transistor. A voltage depending on a voltage of an intermediate node between the second and fourth transistors is outputted as an output signal.

17 Claims, 8 Drawing Sheets

COMPARATOR CIRCUIT

INCORPORATION BY REFERENCE

This application is based upon and claims the benefit of priority from Japanese Patent Application No. 2009-33672 which was filed on Feb. 17, 2009, the disclosure of which is incorporated herein in its entirety by reference.

BACKGROUND OF THE INVENTION

1. Field of the Invention

The present invention relates to a comparator circuit.

2. Description of Related Art

Figure 8:
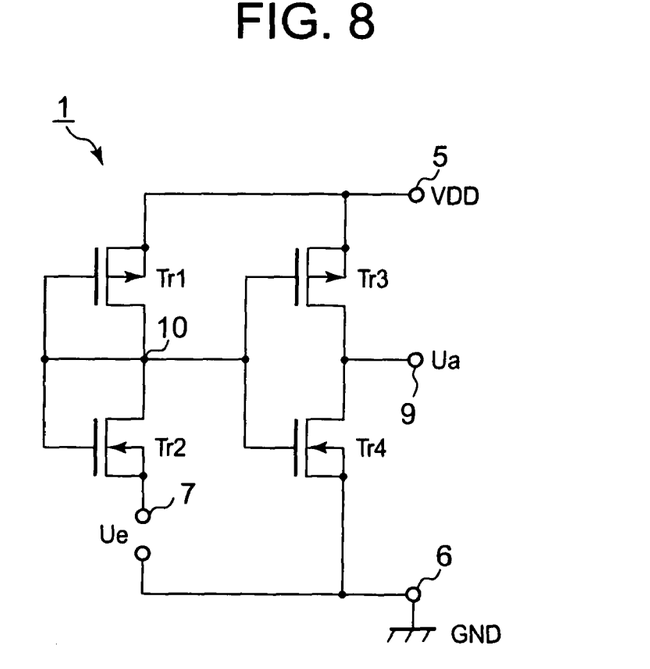
FIG. 8 is a diagram showing a comparator circuit of a related art.

FIG. 8 shows a configuration of the comparator circuit, shown by Patent Document 1 (Japanese Patent Application Laid Open No. Hei 5-249148). As shown in FIG. 8, a comparator circuit 1 includes PMOS transistors Tr1 and Tr3, and NMOS transistors Tr2 and Tr4.

The PMOS transistor Tr1 and the NMOS transistor Tr2 are connected in series between terminals 5 and 7. The PMOS transistor Tr1 and the NMOS transistor Tr2 are connected to each other at a common node 10, and further, their respective gates are connected to the common node 10.

The PMOS transistor Tr3 and the NMOS transistor Tr4 are connected in series between the terminal 5 and a terminal 6. The PMOS transistor Tr3 and the NMOS transistor Tr4 are connected to each other by using a terminal 9 as a common node. The respective gates of the PMOS transistor Tr3 and the NMOS transistor Tr4 are connected to the common node 10.

The terminals 5 and 6 are applied with a potential VDD as an operating voltage and a ground voltage GND, respectively. A target voltage Ue to be detected is inputted across the terminals 7 and 6. The terminal 9 serves as an output terminal of the comparator circuit 1 to output an output voltage signal Ua.

However, the comparator circuit 1 poses problems as given below. First, the comparator circuit 1 is vulnerable to temperature variations and fabrication variations. This is due to the fact that, in order to set a fixed operating threshold of the comparator circuit 1 for Ue>0, the operating threshold is selected so that the NMOS transistors Tr2 and Tr4 may have different transfer characteristic curves. The MOS transistor in an input stage does not have high breakdown voltage characteristics because of a circuit configuration.

Figure 9:
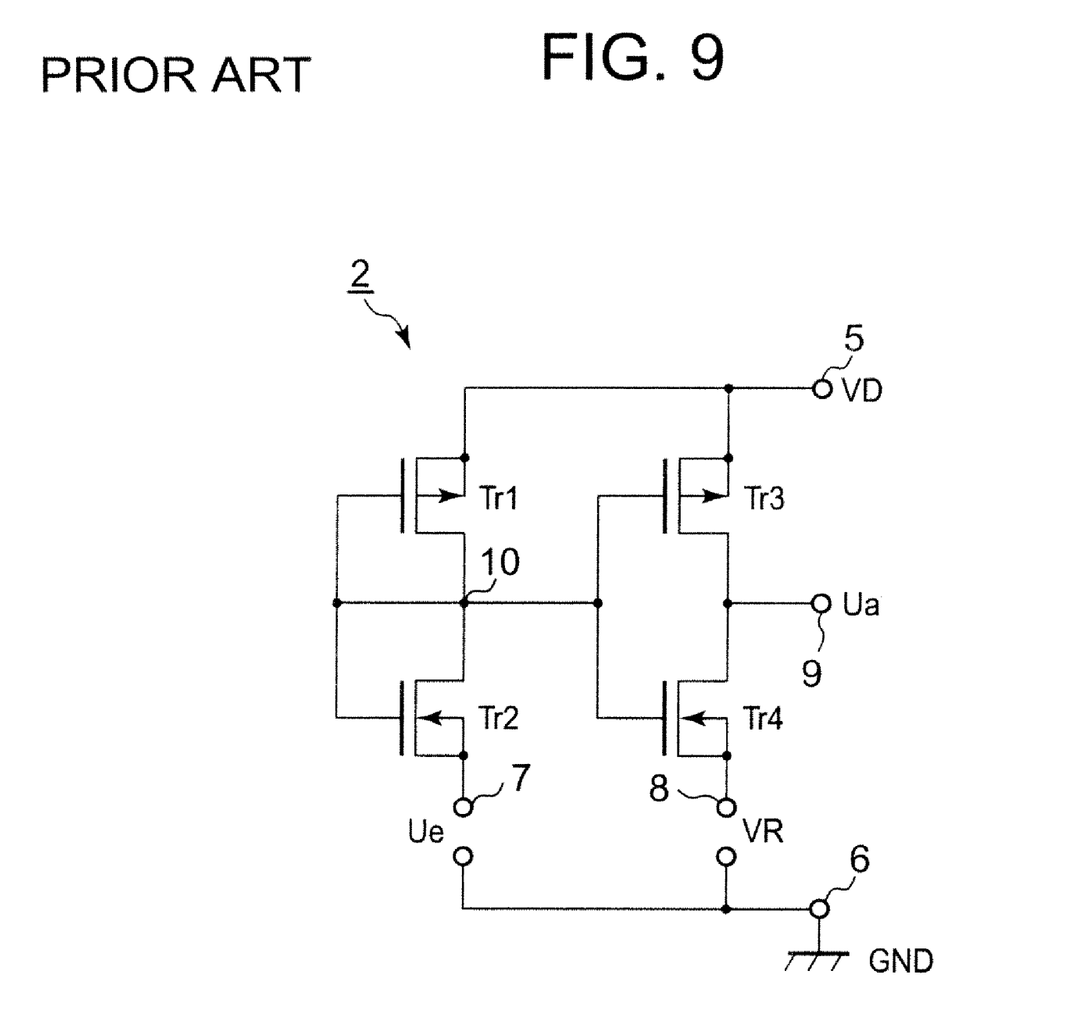
FIG. 9 is a diagram showing another comparator circuit of a related art.

FIG. 9 illustrates a circuit configuration addressing these problems and disclosed in Patent Document 2 (Japanese Patent Application Laid Open No. Hei 9-46191). As shown in FIG. 9, a comparator circuit 2 includes PMOS transistors Tr1 and Tr3, and NMOS transistors Tr2 and Tr4. The PMOS transistor Tr1 and the NMOS transistor Tr2 are connected in series between terminals 5 and 7. The PMOS transistor Tr1 and the NMOS transistor Tr2 are connected to each other at a common node 10, and further, their respective gates are connected to the common node 10.

The PMOS transistor Tr3 and the NMOS transistor Tr4 are connected in series between the terminal 5 and a terminal 8. The PMOS transistor Tr3 and the NMOS transistor Tr4 are connected to each other by using a terminal 9 as a common node. The respective gates of the PMOS transistor Tr3 and the NMOS transistor Tr4 are connected to the common node 10.

The terminal 5 is applied with a positive potential VD of an operating voltage, and a terminal 6 is applied with a standard voltage GND. The terminal 8 is applied with a reference voltage VR. The reference voltage VR acts as a voltage to determine a switching threshold of the comparator circuit 1. A target voltage Ue to be detected is inputted across the terminals 7 and 6. The terminal 9 serves as an output terminal of the comparator circuit 2 to output an output voltage signal Ua.

SUMMARY

Such a comparator circuit 2 poses a problem as given below. The problem of being unable to ensure the output voltage signal with sufficiently large amplitude arises when a high voltage Ue is detected. This is due to the fact that the reference voltage VR is inputted to a current path that forms the terminal 9 as the output terminal, or equivalently, a current path formed of the PMOS transistor Tr3 and the NMOS transistor Tr4.

A comparator circuit of an exemplary aspect according to the present invention, includes first and second terminals to which a reference voltage that determines a threshold voltage is inputted, a third terminal to which a standard voltage is inputted, a fourth terminal to which a target voltage that is to be detected and is based on the standard voltage is inputted, first and second transistors of a first conductivity type including control terminals to the first and second terminals, respectively, the first and second transistors flowing currents depending on a potential difference of the reference voltage, a third transistor of a second conductivity type connected between the first transistor and the fourth terminal, and a fourth transistor of the second conductivity type connected between the second transistor and the third terminal, the fourth transistor flowing a mirror current depending on a current passing through the third transistor passes. A voltage depending on a voltage of an intermediate node between the second and fourth transistors is outputted as an output signal.

The comparator circuit according to the exemplary aspect of the present invention uses the reference voltage as a switching threshold so that an output signal generated at a node between the second and fourth transistors may vary in level to become high or low according to whether or not the target voltage to be detected exceeds the switching threshold. This eliminates the input of the reference voltage to a current path in which the output signal is generated.

According to the exemplary aspect of the present invention, the comparator circuit is capable of ensuring the output signal with sufficiently large amplitude, when a high voltage is detected.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS (First Exemplary Embodiment)

Figure 1:
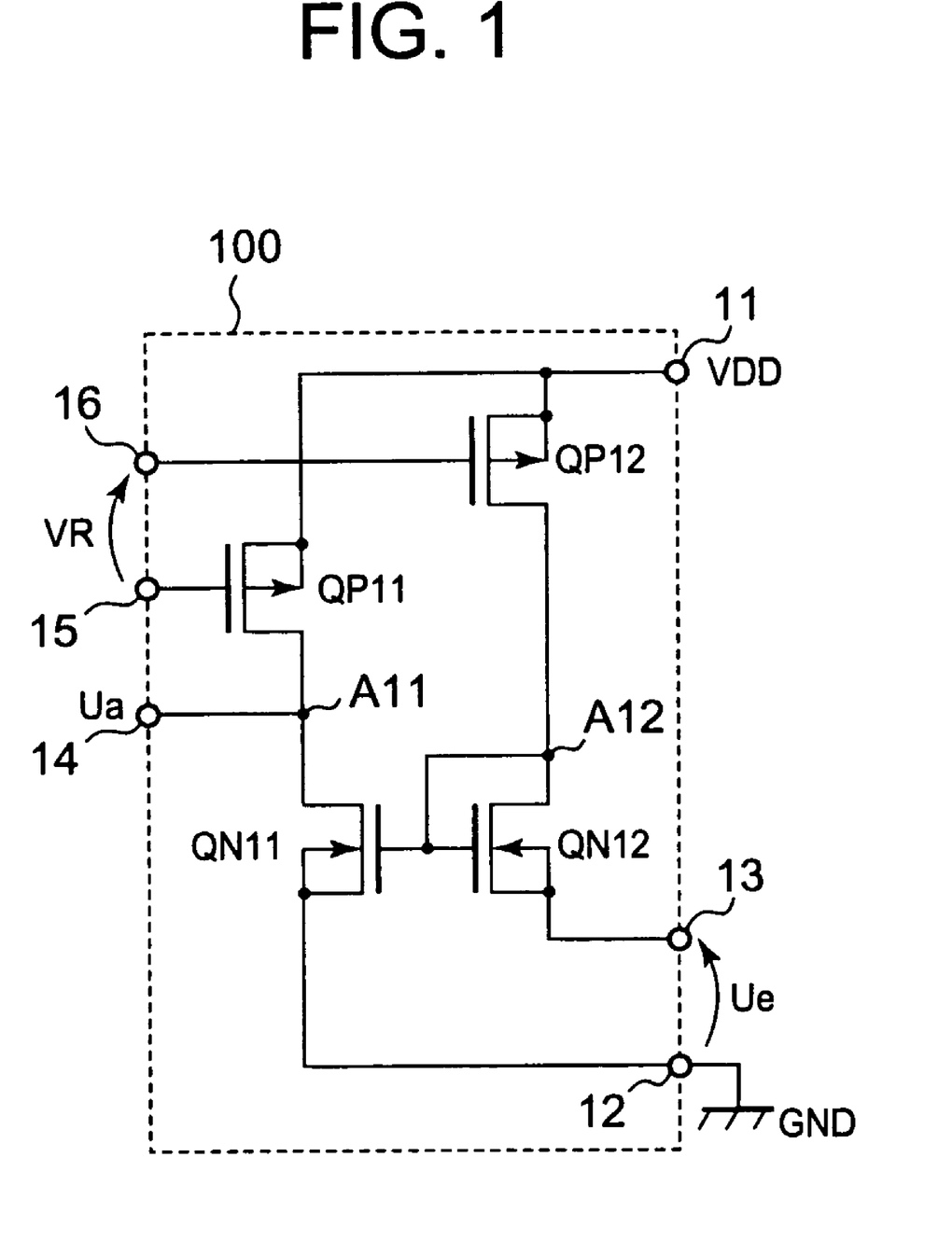
FIG. 1 is a diagram showing a comparator circuit according to a first exemplary embodiment.

FIG. 1 shows a configuration of a comparator circuit 100 according to a first exemplary embodiment. As shown in FIG. 1, the comparator circuit 100 includes PMOS transistors QP11 and QP12, and NMOS transistors QN11 and QN12.

The PMOS transistor QP11 (second transistor) is connected at its source to a terminal 11, at its drain to a node A11, and at its gate to a terminal 15 (second terminal). The PMOS transistor QP12 (first transistor) is connected at its source to the terminal 11 (fifth terminal), at its drain to a node A12, and at its gate to a terminal 16 (first terminal). The NMOS transistor QN11 (fourth transistor) is connected at its drain to the node A11, at its source to a terminal 12 (third terminal), and at its gate to the node A12. The NMOS transistor QN12 (third transistor) is connected at its drain and gate to the node A12, and at its source to a terminal 13 (fourth terminal). The node A11 forms an output terminal 14 to output an output signal Ua. The terminal 11 is supplied with a positive operating voltage VDD. The terminal 12 is supplied with a ground voltage GND lower than the operating voltage VDD. The voltage supplied to the terminal 12, namely, the ground voltage GND as employed in the first exemplary embodiment, serves as a standard voltage for the comparator circuit 100.

A target voltage Ue to be detected is inputted across the terminals 12 and 13. A reference voltage VR is inputted across the terminals 16 and 15. The reference voltage VR acts as a voltage to determine a switching threshold of the comparator circuit 100.

Here, the NMOS transistors QN11 and QN12 form a current mirror with the NMOS transistor QN12 acting as an input transistor. The above-mentioned PMOS transistors QP11 and QP12 are the same in configuration such as transistor size. Further, the NMOS transistors QN11 and QN12 are likewise the same in configuration such as transistor size.

Description will be given with regard to operation of the comparator circuit 100 configured as mentioned above. It will be here assumed that the PMOS transistors QP11 and QP12, and the NMOS transistors QN11 and QN12 are of the same transistor size. The reference voltage VR is inputted across the terminals 16 and 15 (The terminal 16 is on the high potential side). Thus, the PMOS transistors QP11 and QP12 are applied with gate-source voltages that differ by the reference voltage VR. The target voltage Ue to be detected is inputted to the terminal 13. Thus, the NMOS transistors QN11 and QN12 are applied with gate-source voltages that differ by the voltage Ue.

The PMOS transistor QP12 and the NMOS transistor QN12 are connected in series. Thus, a current passing through the PMOS transistor QP12 passes also through the NMOS transistor QN12. The NMOS transistor QN12 has a current mirror connection to the NMOS transistor QN11. Thereby, a current depending on the current passing through the NMOS transistor QN12 passes through the NMOS transistor QN11. However, the voltage Ue is applied to the source of the NMOS transistor QN12. Therefore, the potential of the node A12 also varies according to the voltage Ue. Thus, the current passing through the NMOS transistor QN11 connected at its gate to the node A12, of course, likewise varies according to the voltage Ue.

On the other hand, as mentioned above, the potential applied to the gate of the PMOS transistor QP11 is lower by VR than the potential of the terminal 12. Thus, a current depending on the gate voltage passes through the PMOS transistor QP11.

Here, if the current passing through the NMOS transistor QN11 is equal to the current passing through the PMOS transistor QP11, then the comparator circuit 100 reaches a state of equilibrium. At this time, a voltage ½VDD of the node A11 is outputted as an inactive point of the comparator circuit 110, by the output terminal 15.

In accordance with the above, the relationship between the reference voltage VR and the target voltage Ue to be compared, in the above-mentioned state of equilibrium, is represented as Equation (1), using an equation of current of a general MOS transistor in its saturation region.

$$Ue = \sqrt{\frac{\beta p(W_{QP12}/L_{QP12})}{\beta n(W_{QN12}/L_{QN12})}} \times VR \qquad (1)$$

Incidentally, $W_{QP12}/L_{QP12}$ represents (the channel width of the PMOS transistor QP12)/(the channel length thereof). βp represents (the per-unit-area capacitance of a channel unit of the PMOS transistor QP12)×(the mobility thereof). $W_{QN12}/L_{QN12}$ represents (the channel width of the NMOS transistor QN12)/(the channel length thereof). βn represents (the per-unit-area capacitance of a channel unit of the NMOS transistor QN12)×(the mobility thereof).

When the reference voltage VR and the target voltage Ue to be detected have such a relationship as is represented by Equation (1), the output voltage from the output terminal 15 lies at the inactive point, or ½VDD as employed in the first exemplary embodiment. In other words, the right side of Equation (1) serves as the switching threshold of the comparator circuit 100.

In an instance where the PMOS transistor QP12 and the NMOS transistor QN12 are set for $\beta p(W_{QP12}/L_{QP12}) = \beta n (W_{Qn12}/L_{Qn12})$ and the reference voltage VR is set equal to 0.1 V, the switching threshold of the comparator circuit 100 becomes 0.1 V.

Then, the target voltage Ue to be detected (hereinafter called an input signal Ue) below the switching threshold causes the NMOS transistor QN12 to be more strongly conducting, which in turn lowers the potential of the node A12. This renders the NMOS transistor QN11 non-conducting. Consequently, the potential of the node A11 rises, so that the output signal Ua at a high level is outputted to the output terminal 15.

Conversely, the input signal Ue above the switching threshold causes the NMOS transistor QN12 to be more strongly conducting, which in turn raises the potential of the node A12. This renders the NMOS transistor QN11 conducting. Consequently, the potential of the node A11 drops, so that the output signal Ua at a low level is outputted to the output terminal 15.

As described above, even when the comparator circuit 100 according to the first exemplary embodiment employs such a simple circuit configuration as shown in FIG. 1, by setting the reference voltage VR to a predetermined value, the switching threshold according to the value of the reference voltage VR can be determined. Then, the PMOS transistors QP11 and QP12 or the NMOS transistors QN11 and QN12 included in the comparator circuit 100 are manufactured in the same size by the same manufacturing process. Thus, the PMOS transistors QP11 and QP12 or the NMOS transistors QN11 and QN12 have the same characteristics. Therefore, the comparator circuit 100 has high insensitivity to temperature characteristics and also has high invulnerability to fabrication variations. The comparator circuit 100 has a configuration such that the input signal Ue does not enter a current path that forms the output terminal, or equivalently, the current path formed of the PMOS transistor QP11 and the NMOS transistor QN11, as distinct from the comparator circuit 2.

This provides a solution for the problem of the conventional comparator circuit 1 being vulnerable to temperature variations and fabrication variations, and further, a solution for the problem of the comparator circuit 2 being incapable of ensuring the output voltage signal with sufficiently large amplitude when a high voltage Ue is detected, because of the inputting of the reference voltage VR to an output stage.

Figure 2:
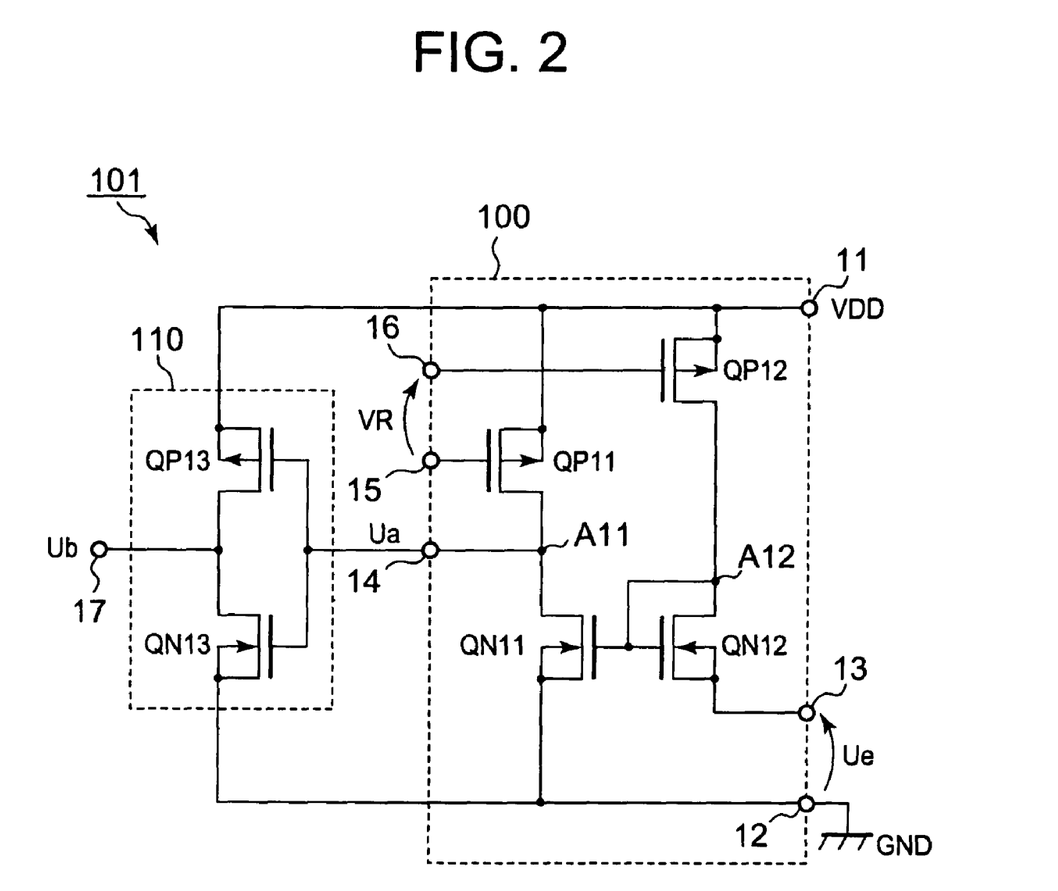
FIG. 2 is a diagram showing another configuration of the comparator circuit according to the first exemplary embodiment.

As shown in FIG. 2, a comparator circuit 101 may be configured by connecting an inverter circuit 110 to the output terminal 15 of the comparator circuit 100. The inverter circuit 110 includes a PMOS transistor QP13 and an NMOS transistor QN13.

The PMOS transistor QP13 is connected at its source to the terminal 11, at its drain to a terminal 17, and at its gate to the output terminal 14 of the comparator circuit 100. The NMOS transistor QN13 is connected at its drain to the terminal 17, at its source to the terminal 12, and at its gate to the output terminal 14 of the comparator circuit 100. Incidentally, the terminal 17 corresponds to an output terminal of the comparator circuit 101, and outputs an output signal Ub.

The inverter circuit 110 functions as a buffer against the comparator circuit 100. This enables a sharper signal change in the output signal Ub with respect to the output signal Ua. Further, plural inverter circuits of the same type may be additionally connected thereby to effect a still sharper change in the output signal. Incidentally, the connection of the inverter circuit causes phase inversion on an output from the preceding stage. In other words, the output signal Ub becomes low if the input signal Ue falls below the switching threshold, or the output signal Ub becomes high if the input signal Ue exceeds the switching threshold.

(Second Exemplary Embodiment)

Figure 3:
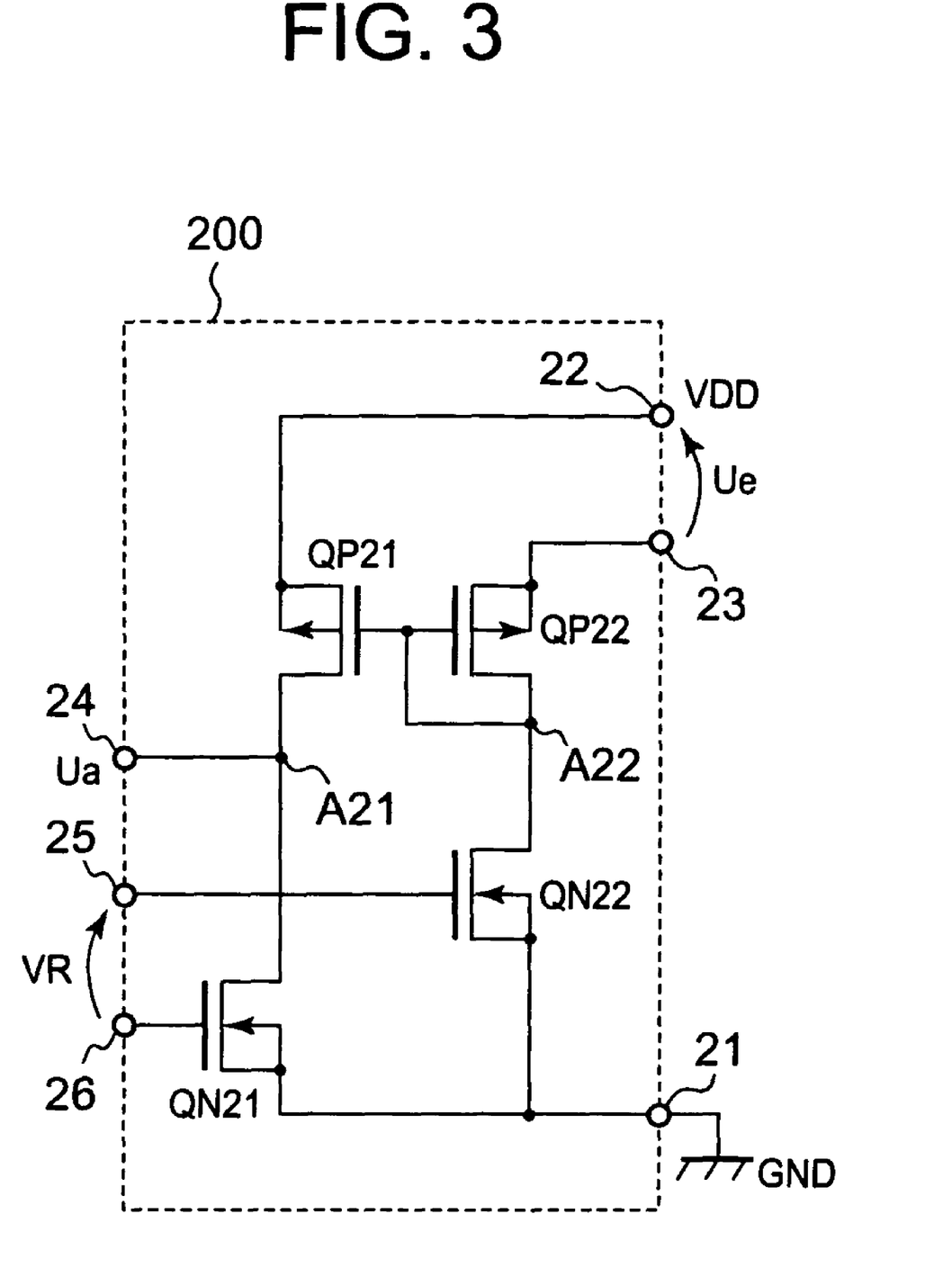
FIG. 3 is a diagram showing a comparator circuit according to a second exemplary embodiment.

FIG. 3 shows a configuration of a comparator circuit 200 according to a second exemplary embodiment. As shown in FIG. 3, the comparator circuit 200 includes PMOS transistors QP21 and QP22, and NMOS transistors QN21 and QN22.

The PMOS transistor QP21 (fourth transistor) is connected at its source to a terminal 22 (third terminal), at its drain to a node A21, and at its gate to a node A22. The PMOS transistor QP22 (third transistor) is connected at its source to a terminal 23 (fourth terminal), and at its drain and gate to the node A22. The NMOS transistor QN21 (second transistor) is connected at its drain to the node A21, at its source to a terminal 21 (fifth terminal), and at its gate to a terminal 26 (second terminal). The NMOS transistor QN22 (first transistor) is connected at its drain to the node A22, at its source to the terminal 21, and at its gate to a terminal 25 (first terminal). The node A21 forms an output terminal 24 to provide the output signal Ua.

The terminal 22 is supplied with the positive operating voltage VDD. The terminal 21 is supplied with the ground voltage GND as a lower voltage than the operating voltage VDD. Here, the voltage VDD supplied to the terminal 22 serves as a standard potential of the comparator circuit 200. The target voltage Ue to be detected is inputted across the terminals 22 and 23. The reference voltage VR is inputted across the terminals 25 and 26. The reference voltage VR acts as a voltage to determine the switching threshold of the comparator circuit 200.

The PMOS transistors QP21 and QP22 are the same in configuration such as transistor size. Further, the NMOS transistors QN21 and QN22 are likewise the same in configuration such as transistor size. The PMOS transistors QP21 and QP22 form a current mirror with the PMOS transistor QP22 acting as an input transistor.

As can be seen also from FIG. 3, the configuration of the comparator circuit 200 according to the second exemplary embodiment is such that the MOS transistors are opposite in electrical conductivity to those of the comparator circuit 100 according to the first exemplary embodiment. Further, the comparator circuit 200 uses the operating voltage VDD in place of the ground voltage GND, as the standard voltage. In accordance with the above, the comparator circuit 200 is suitable for detection of the input signal Ue, based on the positive operating voltage VDD.

Description will be given with regard to operation of the comparator circuit 200 configured as mentioned above. It will be here assumed that the PMOS transistors QP21 and QP22, and the NMOS transistors QN21 and QN22 are of the same transistor size. Here, for the same reason as the first exemplary embodiment, the relationship between the reference voltage VR and the input signal Ue in the state of equilibrium of the comparator circuit 200 is represented as Equation (2).

Incidentally, $W_{QP22}/L_{QP22}$ represents (the channel width of the PMOS transistor QP22)/(the channel length thereof). $\beta p$ represents (the per-unit-area capacitance of a channel unit of the PMOS transistor QP22)×(the mobility thereof). Also, $W_{QN22}/L_{QN22}$ represents (the channel width of the NMOS transistor QN22)/(the channel length thereof). $\beta n$ represents (the per-unit-area capacitance of a channel unit of the NMOS transistor QN22)×(the mobility thereof).

$$Ue = \sqrt{\frac{\beta p (W_{QP22}/L_{QP22})}{\beta n (W_{QN22}/L_{QN22})}} \times VR \quad (2)$$

When the reference voltage VR and the target voltage Ue to be detected have such a relationship as is represented by Equation (2), the output voltage from the output terminal 25 lies at the inactive point of the comparator circuit 200, or ½VDD as employed in the second exemplary embodiment. In other words, the right side of Equation (2) serves as the switching threshold of the comparator circuit 200.

In an instance where the PMOS transistor QP22 and the NMOS transistor QN22 are set for $\beta p(W_{QP22}/L_{QP22})=\beta n(W_{Qn22}/L_{Qn22})$ and the reference voltage VR is set equal to 0.1 V, the switching threshold of the comparator circuit 200 becomes 0.1 V. Incidentally, in this instance, if the operating voltage VDD is 5 V, then the output signal Ua becomes ½VDD when the voltage of the input signal Ue is 4.9 V.

Then, the input signal Ue below the switching threshold causes the PMOS transistor QP22 to be more strongly non-conducting, which in turn lowers the potential of the node A22. This renders the PMOS transistor QP21 conducting. Consequently, the potential of the node A21 rises, so that the output signal Ua at a high level is outputted to the output terminal 25.

Conversely, the input signal Ue above the switching threshold causes the PMOS transistor QP22 to be more strongly conducting, which in turn raises the potential of the node A22. This renders the PMOS transistor QP21 non-conducting. Consequently, the potential of the node A21 drops, so that the output signal Ua at a low level is outputted to the output terminal 25.

As described above, the comparator circuit 200 according to the second exemplary embodiment can select the reference voltage VR applied to the terminals 25 and 26 thereby to determine the switching threshold voltage, as is the case with the first exemplary embodiment. The PMOS transistors QP21 and QP22 or the NMOS transistors QN21 and QN22 included in the comparator circuit 200 are manufactured in the same size by the same manufacturing process or the like. Thus, the PMOS transistors QP21 and QP22 or the NMOS transistors QN21 and QN22 have the same characteristics. Therefore, the comparator circuit 200 has high insensitivity to temperature characteristics and also has high invulnerability to fabrication variations. Thus, the comparator circuit 200 according to the second exemplary embodiment can have high invulnerability to temperature variations and fabrication variations, and also can ensure the output voltage signal with sufficiently large amplitude when a high voltage Ue is detected, as is the case with the first exemplary embodiment.

(Third Exemplary Embodiment)

Figure 4:
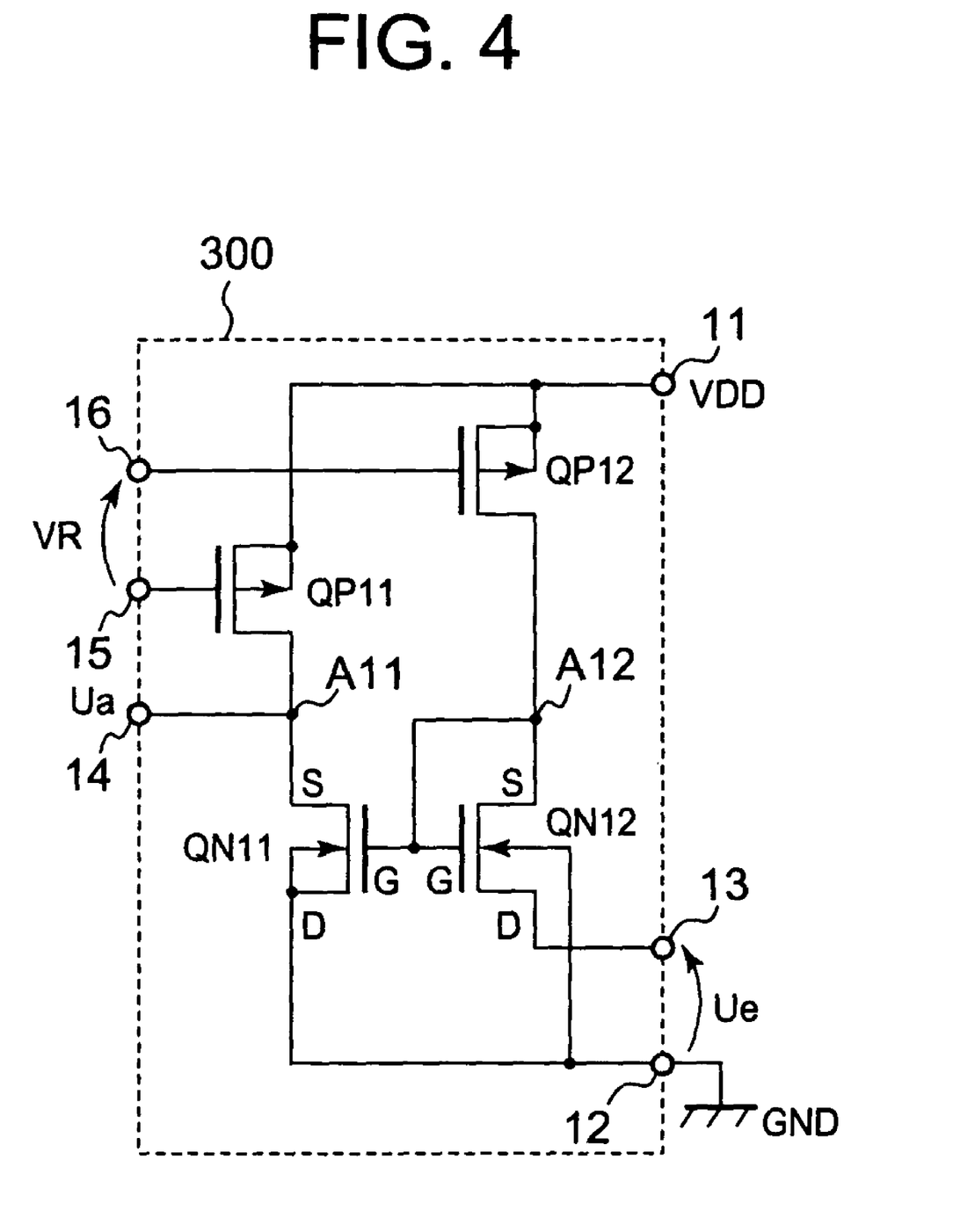
FIG. 4 is a diagram showing a comparator circuit according to a third exemplary embodiment.

FIG. 4 shows a configuration of a comparator circuit 300 according to a third exemplary embodiment. As shown in FIG. 4, the comparator circuit 300 includes the PMOS transistors QP11 and QP12, and the NMOS transistors QN11 and QN12. Incidentally, of structural components designated by the reference characters shown in FIG. 4, those designated by the same reference characters in FIG. 1 indicate the same or similar structural components as or to those in FIG. 1. The third exemplary embodiment is different from the first exemplary embodiment in the configurations of the NMOS transistors QN11 and QN12. With emphasis on the point of difference, therefore, description will be given for the third exemplary embodiment, and description of other parts will be omitted.

In the third exemplary embodiment, the NMOS transistor QN11 is connected at its source to the node A11, at its drain to the terminal 12, and at its gate to the node A12. The NMOS transistor QN12 is connected at its source and gate to the node A12, and at its drain to the terminal 13. Further, a substrate potential of the NMOS transistors QN11 and QN12 is supplied from the terminal 12.

Figure 5:
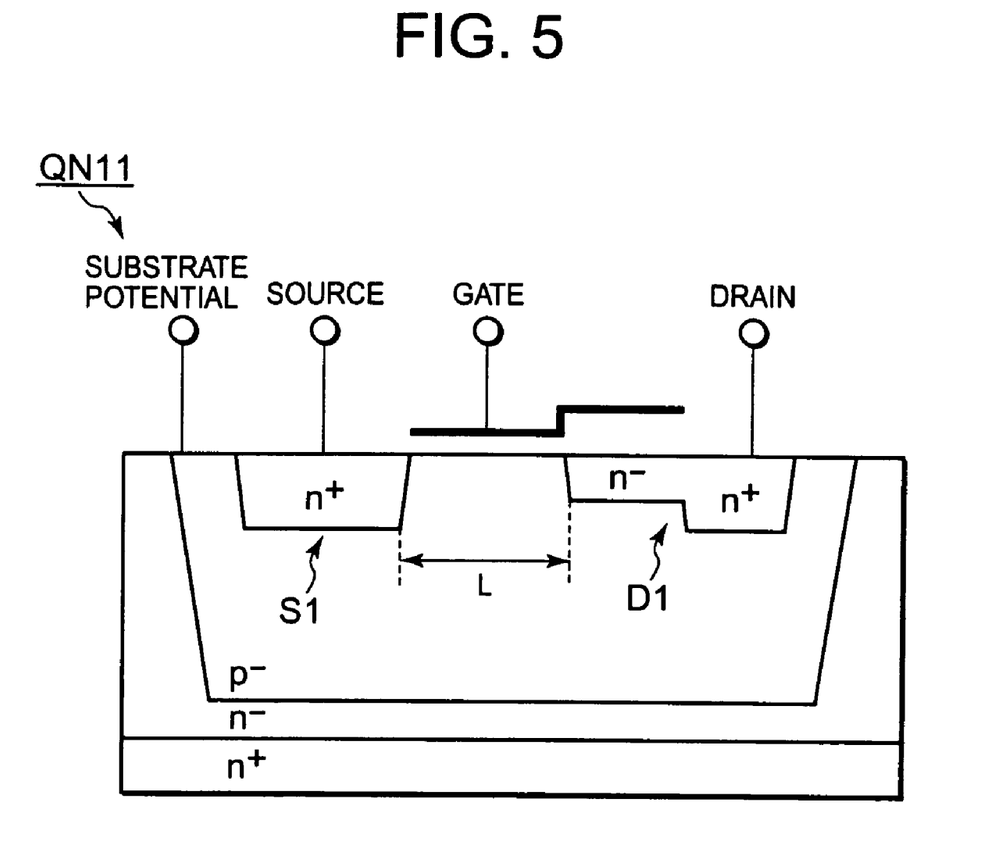
FIG. 5 is a cross-sectional view of an NMOS transistor according to the third exemplary embodiment.

For further detailed description, FIG. 5 shows a cross-sectional view of the NMOS transistors QN11 and QN12. Incidentally, the NMOS transistors QN11 and QN12 are identical in configuration, and thus, description of both transistors will be given, taking the NMOS transistor QN11 as an example.

The NMOS transistor QN11 includes an $n^-$ substrate, and an $n^+$ layer for back contact is provided on the underside of the $n^-$ substrate. The $n^-$ substrate is provided with a $p^-$ layer as a P well of the NMOS transistor QN11. A substrate potential terminal of the NMOS transistor QN11 is connected to the P well. Two n-doped diffusion layers of opposite types are disposed in upper portions of the P well, respectively.

One of the diffusion layers is a diffusion layer D1; and the other, a diffusion layer S1. The diffusion layer S1 has $n^+$ doping, and is in contact with a source terminal. The diffusion layer D1 is separated from the diffusion layer S1 by a gap L. The diffusion layer D1 also has $n^+$ doping, and is in contact with a drain terminal. Note that the diffusion layer D1 has an $n^-$ doped region having a shallower depth, extending from the $n^+$ doped region toward the diffusion layer S1. Here, the gap L between the diffusion layers D1 and S1 corresponds to the channel length of the NMOS transistor QN11. A stepped gate electrode is disposed on the channel with an oxide insulating layer in between. The NMOS transistors QN11 and QN12 having such a configuration have a high breakdown voltage.

Here, the configuration is generally such that the drain and the source are connected in a manner such as the first exemplary embodiment, for utilization of the NMOS transistor. However, the comparator circuit is basically operable, even if the relative connections of the drain and source of the NMOS transistor are in reverse order, as in the case of the third exemplary embodiment. Further, it has been shown that such a circuit has high breakdown voltage characteristics. With such relative connections, however, the NMOS transistor having a high breakdown voltage as shown in FIG. 5 must be used.

Therefore, by using the NMOS transistors QN11 and QN12 having a high breakdown voltage as shown in FIG. 5, and by providing the relative connections of the source and drain as mentioned above, the comparator circuit 300 can have higher breakdown voltage characteristics.

Incidentally, a substrate potential of the NMOS transistor QN12 is connected to the terminal 12 as shown in FIG. 4. This ensures that the input voltage Ue can take on any given large positive value. The reason is that, when the voltage of the input signal Ue exceeds the voltage of the output signal Ua, the NMOS transistor QN12 is cut off.

(Fourth Exemplary Embodiment)

Figure 6:
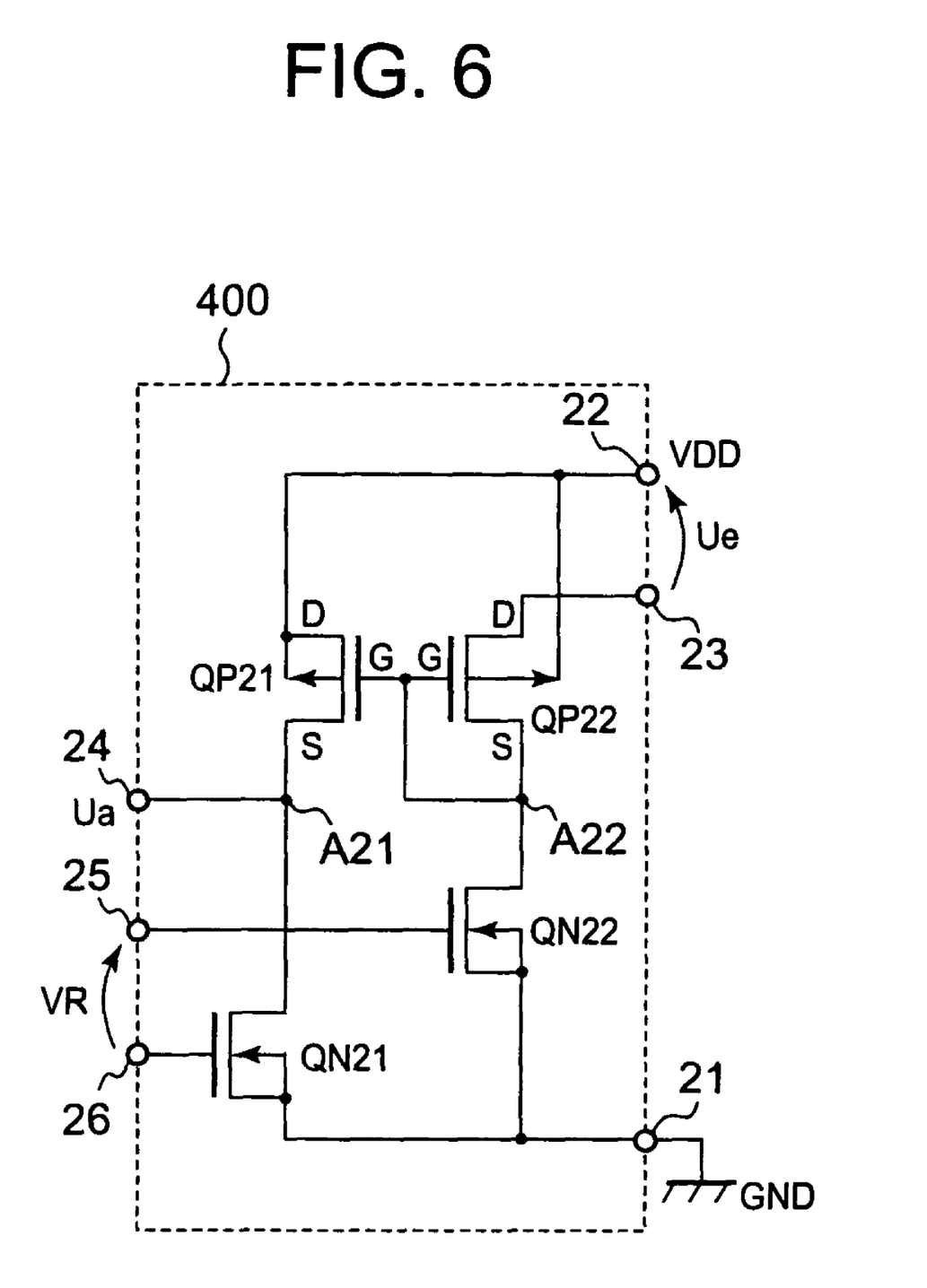
FIG. 6 is a diagram showing a comparator circuit according to a fourth exemplary embodiment.

FIG. 6 shows a configuration of a comparator circuit 400 according to a fourth exemplary embodiment. As shown in FIG. 6, the comparator circuit 400 includes the PMOS transistors QP21 and QP22, and the NMOS transistors QN21 and QN22. Incidentally, of structural components designated by the reference characters shown in FIG. 6, those designated by the same reference characters in FIG. 3 indicate the same or similar structural components as or to those in FIG. 3. The fourth exemplary embodiment is different from the second exemplary embodiment in the configurations of the PMOS transistors QP21 and QP22. With emphasis on the point of difference, therefore, description will be given for the fourth exemplary embodiment, and description of other parts will be omitted.

In the fourth exemplary embodiment, the PMOS transistor QP21 is connected at its source to the node A21, at its drain to the terminal 22, and at its gate to the node A22. The PMOS transistor QP22 is connected at its source and gate to the node A22, and at its drain to the terminal 23. Further, a substrate potential of the PMOS transistors QP21 and QP22 is supplied from the terminal 22.

Figure 7:
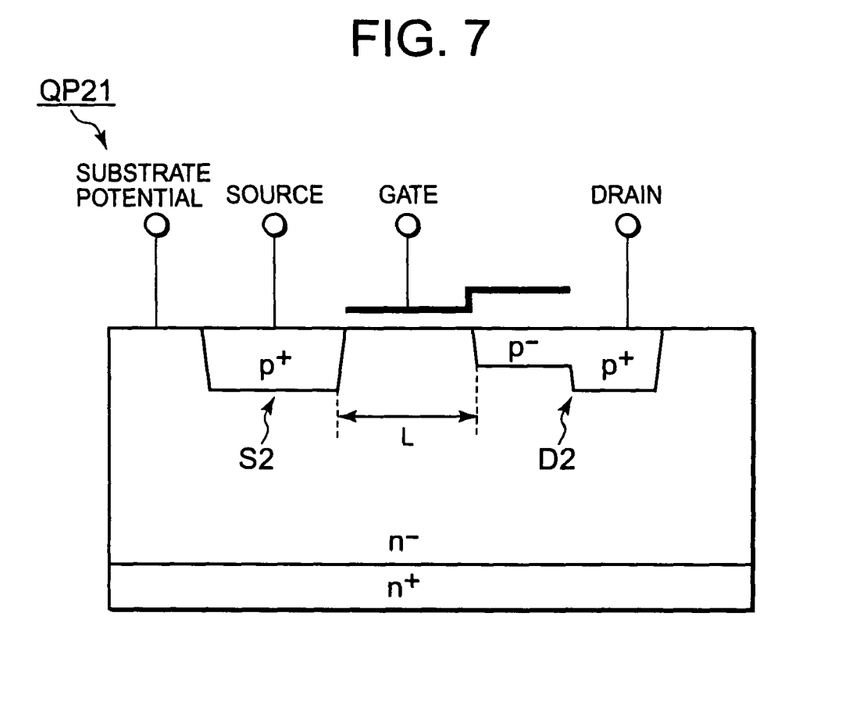
FIG. 7 is a cross-sectional view of an NMOS transistor according to the fourth exemplary embodiment.

For further detailed description, FIG. 7 shows a cross-sectional view of the PMOS transistors QP21 and QP22. Incidentally, the PMOS transistors QP21 and QP22 are identical in configuration, and thus, description of both transistors will be given, taking the PMOS transistor QP21 as an example.

The PMOS transistor QP21 includes an $n^-$ substrate, and an $n^+$ layer for back contact is provided on the underside of the $n^-$ substrate. The $n^-$ substrate is a substrate of the PMOS transistor QP21. A substrate potential terminal of the PMOS transistor QP21 is connected to the $n^-$ substrate. Two p-doped diffusion layers of opposite types are disposed in upper portions of the $n^-$ substrate, respectively.

One of the diffusion layers is a diffusion layer D2; and the other, a diffusion layer S2. The diffusion layer S2 has $p^+$ doping, and is connected to a source terminal. The diffusion layer D2 is separated from the diffusion layer S2 by the gap L. The diffusion layer D2 also has $n^+$ doping, and is connected to a drain terminal. Note that the diffusion layer D2 has a $p^-$ doped region having a shallower depth, extending from the $p^+$ doped region toward the diffusion layer S2. Here, the gap L between the diffusion layers D2 and S2 corresponds to the channel length of the PMOS transistor QP21. A stepped gate electrode is disposed on the channel with an oxide insulating layer in between. The PMOS transistors QP21 and QP22 having such a configuration have a high breakdown voltage.

Here, the configuration is generally such that the drain and the source are connected in a manner such as the second exemplary embodiment, for utilization of the PMOS transistor. However, the comparator circuit is basically operable, even if the relative connections of the drain and source of the PMOS transistor are in reverse order, as in the case of the fourth exemplary embodiment. Further, it has been shown that such a circuit has high breakdown voltage characteristics. With such relative connections, however, the PMOS transistor having high a breakdown voltage as shown in FIG. 7 must be used.

Therefore, by using the PMOS transistors QP21 and QP22 having high breakdown voltage as shown in FIG. 7, and by providing the relative connections of the source and drain as mentioned above, the comparator circuit 400 can have higher breakdown voltage characteristics.

Incidentally, a substrate potential of the PMOS transistor QP22 is connected to the terminal 22 as shown in FIG. 6. This ensures that the input voltage Ue can take on a very low value, as compared to the voltage VDD as the standard voltage. The reason is that, when the voltage of the input signal Ue falls below the voltage of the output signal Ua, the PMOS transistor QP22 is cut off.

Note that the present invention is not limited to the above exemplary embodiments and changes can be appropriately made in the invention without departing from gist of the invention. For example, also in the second to fourth exemplary embodiments, plural inverter circuits may be connected as the buffers to the output terminal, as in the case of the first exemplary embodiment.

Further, it is noted that Applicant's intent is to encompass equivalents of all claim elements, even if amended later during prosecution.

What is claimed is:

1. A comparator circuit, comprising:
   first and second terminals, a reference voltage that determines a threshold voltage being inputted between the first and second terminals;
   a third terminal to which a standard voltage is inputted;
   a fourth terminal to which a target voltage that is to be detected and is based on the standard voltage is inputted;
   first and second transistors of a first conductivity type including control terminals connected to the first and second terminals, respectively, the first and second transistors flowing currents depending on a potential difference of the reference voltage;
   a third transistor of a second conductivity type connected between the first transistor and the fourth terminal; and
   a fourth transistor of the second conductivity type connected between the second transistor and the third terminal, the fourth transistor flowing a mirror current depending on a current passing through the third transistor,
   wherein a voltage depending on a voltage of an intermediate node between the second and fourth transistors is outputted as an output signal that includes a comparison result between the reference voltage and a voltage difference between the target voltage and the standard voltage.

2. The comparator circuit according to claim 1, wherein:
   the third and fourth transistors comprises MOS transistors each having a high breakdown voltage;
   a drain of the first transistor is connected to a drain of the third transistor; and
   a drain of the second transistor is connected to a drain of the fourth transistor.

3. The comparator circuit according to claim 1, wherein the third transistor comprises an MOS transistor, and
   wherein a substrate terminal of the third transistor is connected to the third terminal.

4. The comparator circuit according to claim 1 wherein:
   the first and second transistors have a same configuration; and
   the third and fourth transistors have a same configuration.

5. The comparator circuit according to claim 1, wherein:
   the first and third transistors are connected in series between a fifth terminal and the fourth terminal;
   the second and fourth transistors are connected in series between the fifth terminal and the third terminal; and
   an operating voltage of the comparator circuit is applied across the third and fifth terminals.

6. The comparator circuit according to claim 5, wherein the standard voltage inputted to a source of the fourth transistor is a ground voltage.

7. The comparator circuit according to claim 5, wherein the standard voltage inputted to a source of the fourth transistor is a power supply voltage.

8. The comparator circuit according to claim 1, further comprising at least one inverter circuit that buffers the voltage of the intermediate node between the second and fourth transistors.

9. The comparator circuit according to claim 4, wherein the first and second transistors have a same size, and
   wherein the third and fourth transistors have a same size.

10. The comparator circuit according to claim 1, wherein a drain of the first transistor is coupled to a drain of the third transistor such that a current passing through the first transistor passes through the third transistor.

11. The comparator circuit according to claim 1, wherein different potentials are applied to the control terminals of the first and second transistors.

12. The comparator circuit according to claim 1, wherein the reference voltage is independent of a threshold voltage of the third transistor.

13. A method of operating a comparator, the comparator comprising:
   a first power source terminal;
   a second power source terminal;
   a first transistor of a first conductivity type coupled between the first power source terminal and a first node, and including a first control gate coupled to a first terminal;
   a second transistor of the first conductivity type coupled between the first power source terminal and a second node, and including a second control gate coupled to a second terminal;
   a third transistor of a second conductivity type coupled between the first node and a third terminal, and including a third control gate coupled to the first node;
   a fourth transistor of the second conductivity type coupled between the second node and the second power source terminal, and including a fourth control gate coupled to the first node; and
   a fourth terminal coupled to the second node,
   the method comprising:
      applying a voltage potential difference as a reference voltage between the first and second terminals;
      applying a target voltage to be detected to the third terminal; and
      outputting an output signal from the fourth terminal which includes a comparison result between the reference voltage and a voltage difference between the target voltage and a potential at the second power source terminal.

14. The method according to claim 13, wherein the first and second transistors have a same size, and
wherein the third and fourth transistors have a same size.

15. The method according to claim 13, wherein a drain of the first transistor is coupled to a drain of the third transistor such that a current passing through the first transistor passes through the third transistor.

16. The method according to claim 13, wherein different potentials are applied to the first control gate and the second control gate.

17. The method according to claim 13, wherein the reference voltage is independent of a threshold voltage of the third transistor.

* * * * *